(12) United States Patent
Tobinaga

(10) Patent No.: US 11,003,220 B2
(45) Date of Patent: May 11, 2021

(54) ELECTRONIC APPARATUS

(71) Applicant: Panasonic Intellectual Property Management Co., Ltd., Osaka (JP)

(72) Inventor: Masato Tobinaga, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 106 days.

(21) Appl. No.: 16/591,887

(22) Filed: Oct. 3, 2019

(65) Prior Publication Data
US 2020/0033915 A1    Jan. 30, 2020

Related U.S. Application Data

(63) Continuation of application No. PCT/JP2018/006344, filed on Feb. 22, 2018.

(30) Foreign Application Priority Data

Apr. 4, 2017   (JP) .............................. JP2017-074408

(51) Int. Cl.
*G06F 1/16*   (2006.01)
*H01R 13/24*   (2006.01)
(Continued)

(52) U.S. Cl.
CPC ....... *G06F 1/1656* (2013.01); *H01R 13/2414* (2013.01); *H01R 13/658* (2013.01);
(Continued)

(58) Field of Classification Search
None
See application file for complete search history.

(56) References Cited

U.S. PATENT DOCUMENTS 5,142,101 A * 8/1992 Matsuzaki ........... H05K 9/0015
174/354

7,139,462 B1 * 11/2006 Richtman ............ G02B 6/4471
385/137
(Continued)

FOREIGN PATENT DOCUMENTS

JP    09-153695 A    6/1997
JP    09-162583 A    6/1997
(Continued)

OTHER PUBLICATIONS

International Search Report and Written Opinion for corresponding International Application No. PCT/JP2018/006344, dated May 15, 2018.

*Primary Examiner* — Anthony Q Edwards
*Assistant Examiner* — Rashen E Morrison
(74) *Attorney, Agent, or Firm* — Renner, Otto, Boisselle & Sklar, LLP

(57) ABSTRACT

An electronic apparatus includes a housing having conductivity, an electronic component includes an outer shell having conductivity, and an electrically conductive elastic member. The electrically conductive elastic member has conductivity and elasticity and is disposed between the outer shell of the electronic component and a predetermined inner surface of the housing. A pair of ribs stand on the predetermined inner surface. The electrically conductive elastic member is disposed between the pair of the ribs. The ribs have facing side surfaces facing each other, each of the facing side surfaces has an inclined surface in such a way that each of the facing side surfaces and the predetermined inner surface is in continuous contact with a corresponding part of an outer surface of the electrically conductive elastic member that is compressed, each of the facing side surfaces and the predetermined inner surface facing the corresponding part of the outer surface.

7 Claims, 9 Drawing Sheets

(51) Int. Cl.
*H01R 13/658* (2011.01)
*H01R 13/66* (2006.01)
*H05K 9/00* (2006.01)

(52) U.S. Cl.
CPC ......... *H01R 13/665* (2013.01); *H05K 9/0015* (2013.01); *H01R 2201/06* (2013.01)

(56) References Cited

U.S. PATENT DOCUMENTS

| | | | |
|---|---|---|---|
| 8,238,119 B2* | 8/2012 | Shiroishi | G06F 1/1656 361/807 |
| 2011/0149545 A1* | 6/2011 | Shiroishi | G06F 1/1656 361/816 |
| 2014/0162483 A1* | 6/2014 | Chu | H01R 13/5202 439/271 |
| 2016/0118753 A1* | 4/2016 | Ikuta | H05K 5/0278 439/587 |
| 2016/0205766 A1* | 7/2016 | Blum | H05K 5/0247 361/749 |
| 2018/0063981 A1* | 3/2018 | Park | H05K 5/0017 |
| 2019/0379166 A1* | 12/2019 | Felde | H01R 13/6581 |
| 2020/0033915 A1* | 1/2020 | Tobinaga | H01R 13/2414 |
| 2020/0357363 A1* | 11/2020 | Reich | H04W 4/80 |

FOREIGN PATENT DOCUMENTS

| | | |
|---|---|---|
| JP | 2001-077576 A | 3/2001 |
| JP | 2008-103646 A | 5/2008 |
| JP | 2011-134499 A | 7/2011 |
| JP | 2013-120307 A | 6/2013 |
| JP | 2015-153920 A | 8/2015 |

\* cited by examiner

ELECTRONIC APPARATUS

BACKGROUND

1. Technical Field

The present disclosure relates to an electronic apparatus having an electrically conductive elastic member.

2. Description of the Related Art

Patent Literature 1 (PTL 1) discloses a structure that provides electrical continuity between a metal sheet being disposed inside an imaging device and being connected to a ground and a conductive cover through a compressed electromagnetic interference (EMI) gasket.

Here, PTL 1 is Unexamined Japanese Patent Publication No. 2013-120307.

SUMMARY

When the EMI gasket is compressed, the EMI gasket may roll and positionally deviate.

The present disclosure provides an electronic apparatus that inhibits an electrically conductive elastic member from rolling and hinders unnecessary emission of electromagnetic noise.

An electronic apparatus according to an aspect of the present disclosure includes a housing having conductivity, an electronic component and an electrically conductive elastic member. The electronic component includes an outer shell having conductivity, the electronic component being housed in the housing in such a way that the outer shell is separated from a predetermined inner surface of the housing. The electrically conductive elastic member has conductivity and elasticity and is disposed between the outer shell of the electronic component and the predetermined inner surface of the housing in such a way that the electrically conductive elastic member is compressed by the outer shell and the predetermined inner surface. A pair of first ribs stand on the predetermined inner surface so as to extend parallel to each other with a first predetermined space provided between the first ribs. The electrically conductive elastic member is disposed between the pair of the first ribs. The first ribs have first facing side surfaces facing each other, each of the first facing side surfaces has a first inclined surface in such a way that each of the first facing side surfaces and the predetermined inner surface is in continuous contact with a corresponding part of an outer surface of the electrically conductive elastic member that is compressed, each of the first facing side surfaces and the predetermined inner surface facing the corresponding part of the outer surface.

According to the aspect of the present disclosure, the electrically conductive elastic member is disposed between the pair of the first ribs. This prevents the electrically conductive elastic member from moving to outside a region between the pair of the first ribs. Hence, this configuration inhibits the electrically conductive elastic member from rolling. The electrically conductive elastic member is disposed between the outer shell of the electronic component and the predetermined inner surface of the housing such that the electrically conductive elastic member is compressed by the outer shell and the predetermined inner surface. The electrically conductive elastic member is allowed to come into continuous contact with the first facing side surface of each of the first ribs and the predetermined inner surface of the housing. This hinders unnecessary emission of electromagnetic noise.

DETAILED DESCRIPTION

Exemplary embodiments will be described in detail below with reference to the drawings as appropriate. However, detailed description more than necessary may be omitted. For example, the detailed description of well-known matters and redundant description of structures that are substantially the same may be omitted. This is to avoid unnecessary redundancy in the following description and to facilitate understanding by those skilled in the art.

Note that the present inventor will provide the accompanying drawings and the following description for those skilled in the art to sufficiently understand the present disclosure, and does not intend to limit the subject matter described in the claims.

First Exemplary Embodiment

A first exemplary embodiment will now be described with reference to the drawings.

[1. Configuration]

[1-1. Outline]

Figure 1:
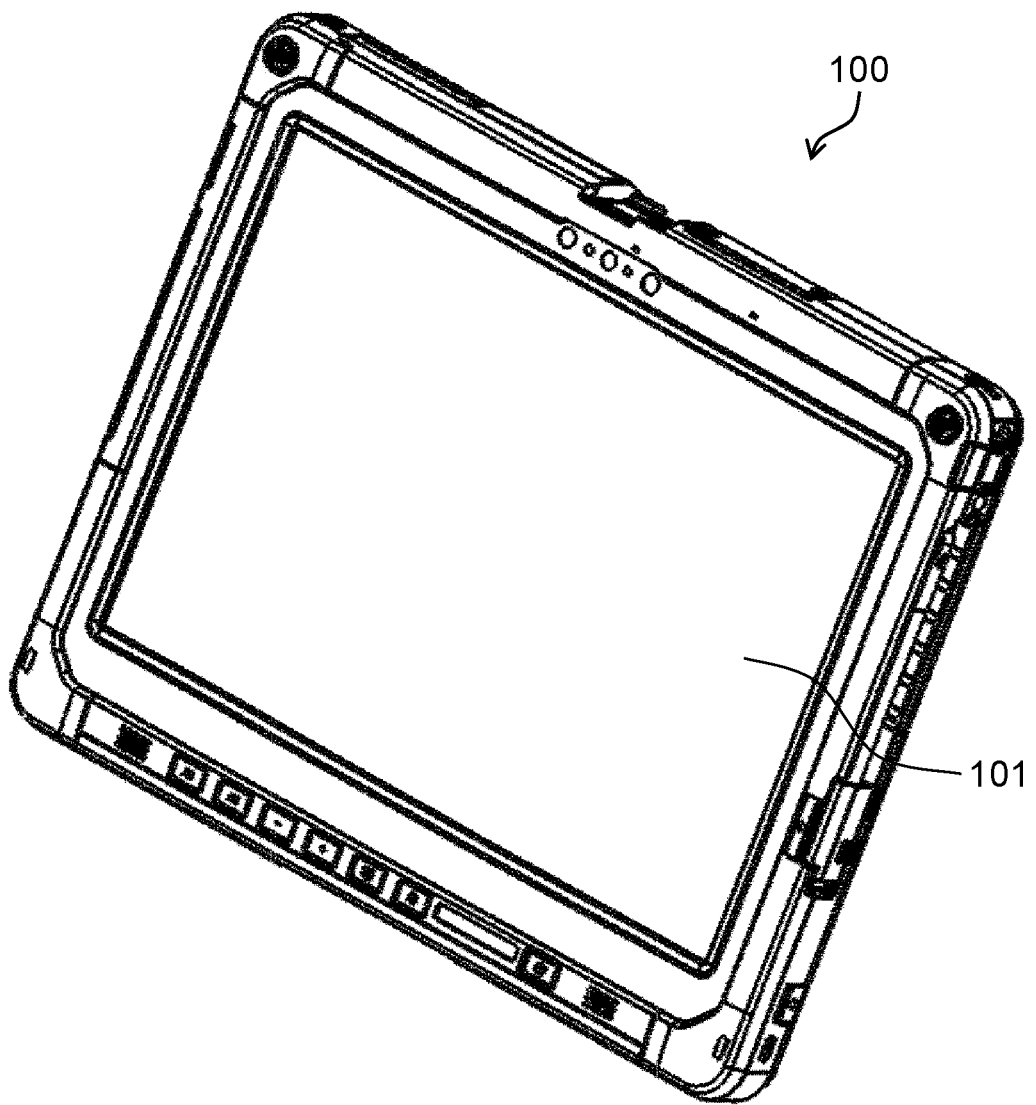
FIG. 1 is a perspective view of a front of a tablet computer according to a first exemplary embodiment.
Figure 2:
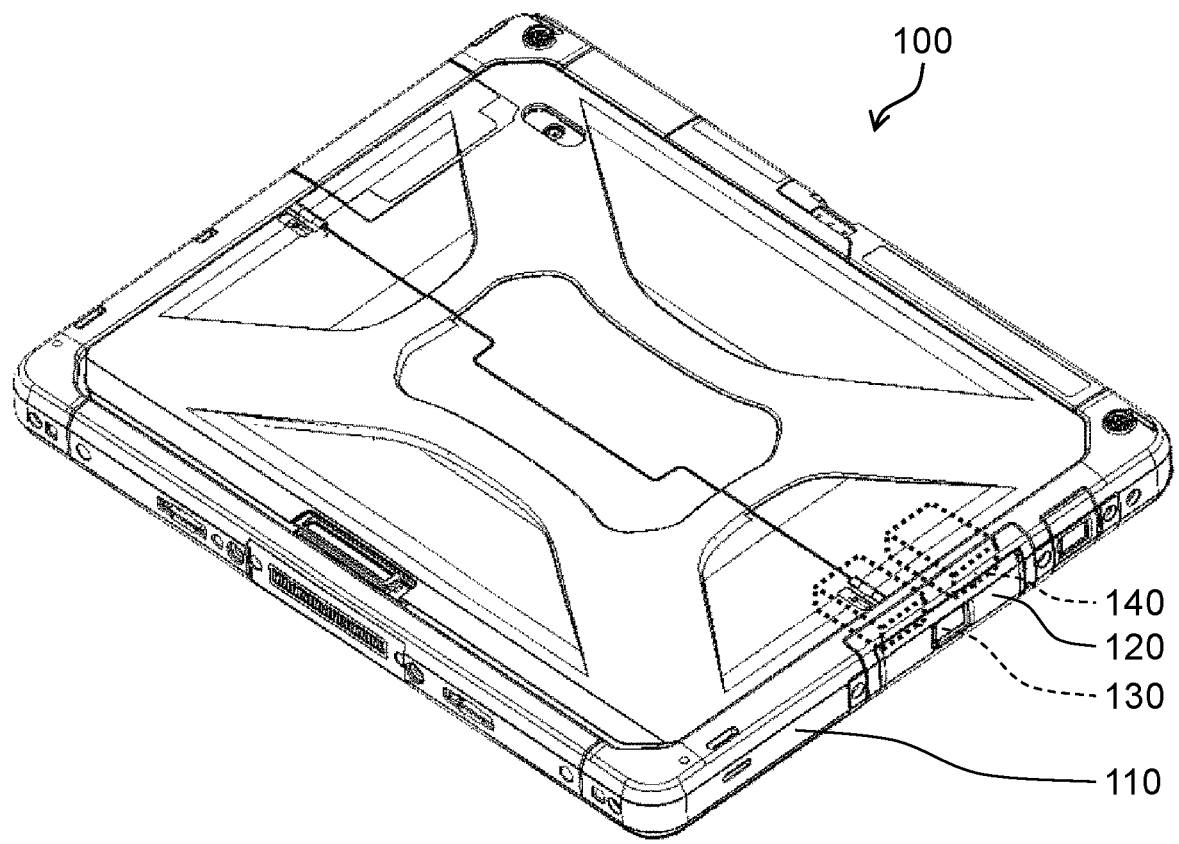
FIG. 2 is a perspective view of a rear of the tablet computer.

FIG. 1 is a perspective view of a front of a tablet computer according to a first exemplary embodiment. FIG. 2 is a perspective view of a rear of the tablet computer.

A front of tablet computer 100 has display 101. Display 101 is composed of, for example, a liquid crystal display panel. Further, display 101 has a touch panel capable of receiving touch operation by a user. Various electronic components such as a central processing unit (CPU), a volatile storage device (RAM), a non-volatile storage device (e.g., ROM and SSD), and a communication module are contained in tablet computer 100. A battery that supplies electric power to these electronic components is contained in tablet computer 100. In the nonvolatile storage device (such as the ROM and the SSD), an operating system (OS), various application programs, various data, and the like are stored. The CPU reads the OS, the application programs, and the various data and performs arithmetic processing to achieve various functions in tablet computer 100.

Housing 110 of tablet computer 100 is made of, for example, resin or metal such as a magnesium alloy. Housing 110 has conductivity either partially or entirely.

FIG. 2 is a perspective view of a rear of tablet computer 100. As shown in FIG. 2, high-definition multimedia interface (HDMI, registered trademark) connector 130 and universal serial bus (USB) connector 140 are disposed inside a side of tablet computer 100. These connectors can be accessed when lid 120 is opened.

Figure 3:
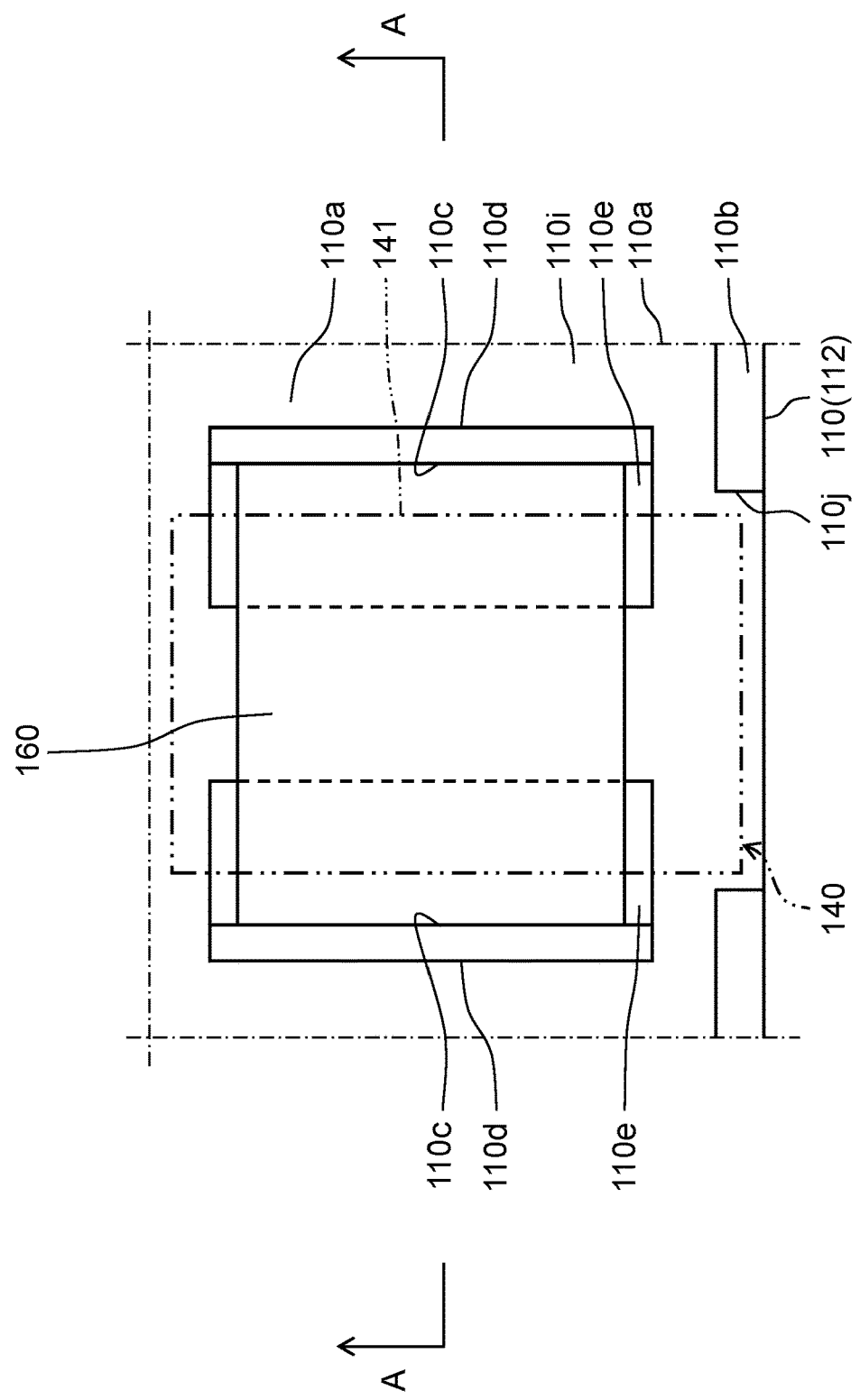
FIG. 3 is a schematic plan view showing a portion of the tablet computer in which a USB connector is disposed.
Figure 4:
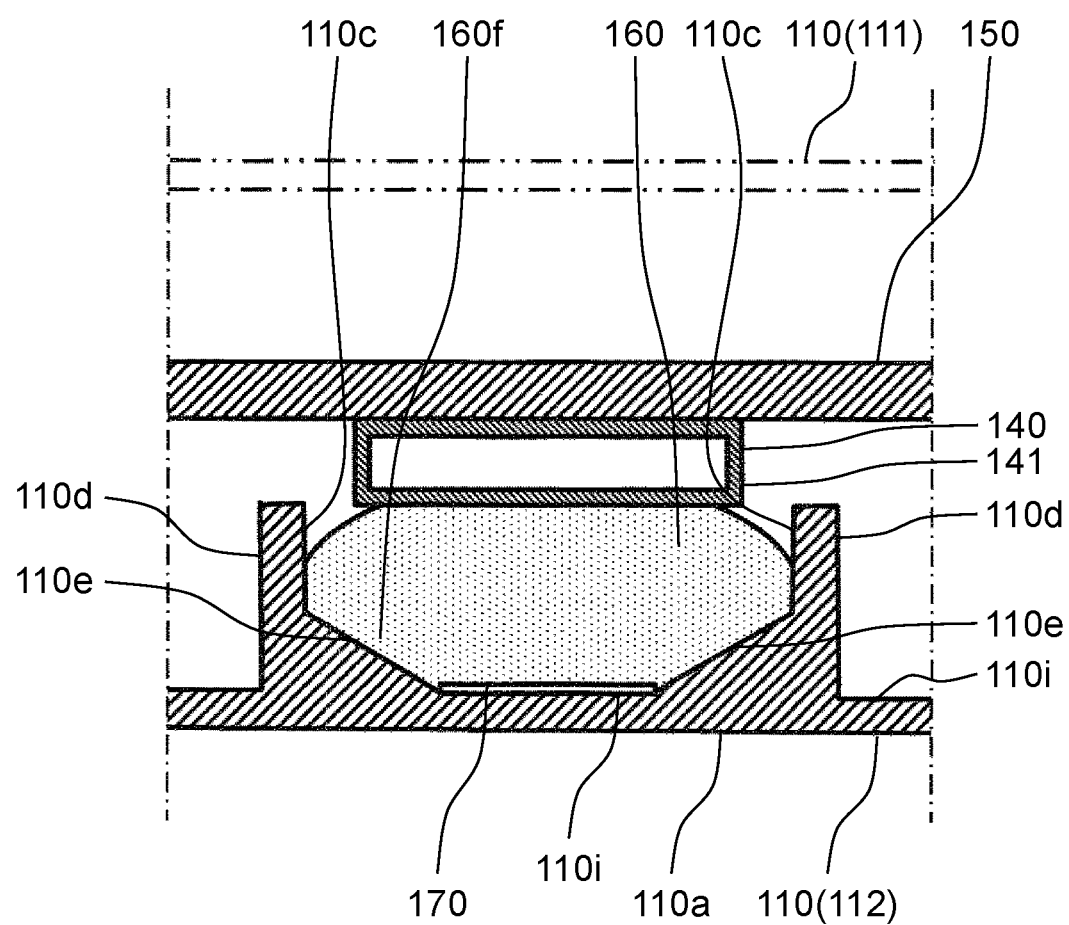
FIG. 4 is a cross-sectional view taken along line A-A of FIG. 3.

FIG. 3 is a schematic plan view showing a portion of tablet computer 100 in which USB connector 140 is disposed. FIG. 4 is a cross-sectional view taken along line A-A of FIG. 3. In FIG. 3, illustration of front housing 111 and substrate 150 is omitted. As shown in FIG. 4, housing 110 includes front housing 111 forming the front of housing 110 and rear housing 112 forming the rear of housing 110. USB connector 140 is mounted on a surface of substrate 150 facing rear housing 112. Substrate 150 is fixed to rear housing 112 with screws (not shown) or other fasteners. USB connector 140 includes shell 141 being made of metal and having conductivity. USB connector 140 is housed in housing 110 such that shell 141 is separated from an inner surface of rear part 110a of rear housing 112. Shell 141 is electrically connected to a ground of substrate 150. An internal space of shell 141 houses a plurality of signal/electric power terminals or pins (not shown) that comes into contact with a plurality of signal/electric power terminals on a USB connector (plug) of an external device or a connection cable to receive or send signals and electric power when the USB connector (plug) is connected. High-frequency signals that are allowed to transmit according to the USB standard flow through these terminals. As shown in FIG. 3, side part 110b of rear housing 112 has opening 110j to let an inlet of USB connector 140 face outside.

As shown in FIGS. 3 and 4, gasket 160 is disposed between shell 141 of USB connector 140 and inner surface 110i of rear part 110a of housing 110 (hereinafter referred to as "rear inner surface 110i") such that the gasket is compressed by shell 141 and rear inner surface 110i. Gasket 160 is, for example, has a structure in which a spongy elastic body is covered with a conductive cloth and hence has conductivity and elasticity. Gasket 160 is fastened to rear inner surface 110i with double-sided tape 170 having conductivity.

On rear inner surface 110i of housing 110, a pair of first ribs 110d stand so as to extend parallel to each other, with first predetermined space r1 (refer to FIG. 5A) provided between the first ribs. Gasket 160 is disposed between the pair of first ribs 110d.

Each one first rib 110d has right and left side surfaces of which first facing side surface 110c is placed face-to-face with other first rib 110d. Each first facing side surface 110c is provided with first inclined surface 110e. First inclined surface 110e is formed such that first facing side surface 110c and rear inner surface 110i come into continuous contact with portion 160f of an outer surface of compressed gasket 160. Portion 160f faces side surface 110c and rear inner surface 110i.

Figure 5A:
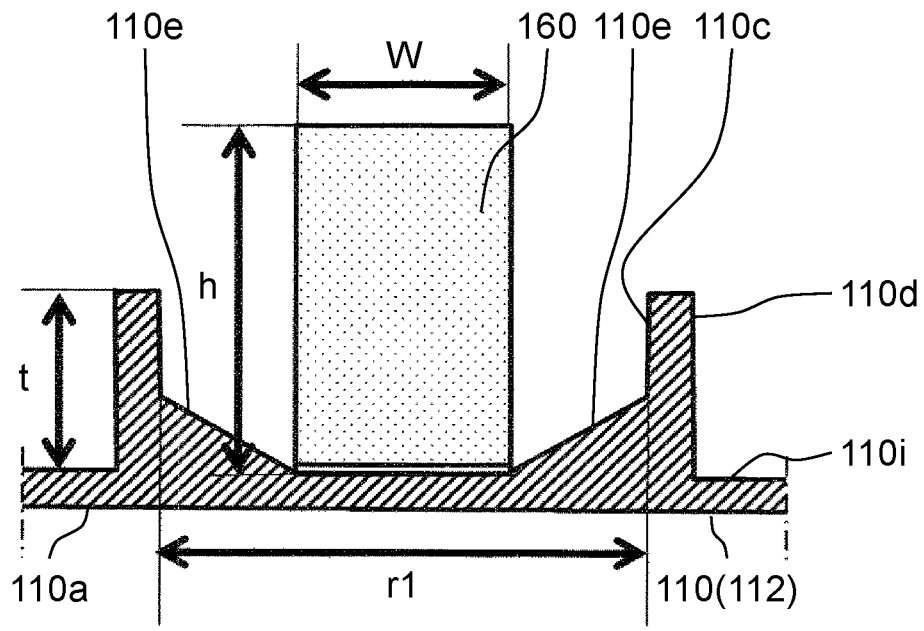
FIG. 5A is a drawing illustrating a relationship between a space between a pair of first ribs, a height of the pair of the first ribs, and a shape of first inclined surfaces and a shape of a gasket before being compressed.
Figure 5B:
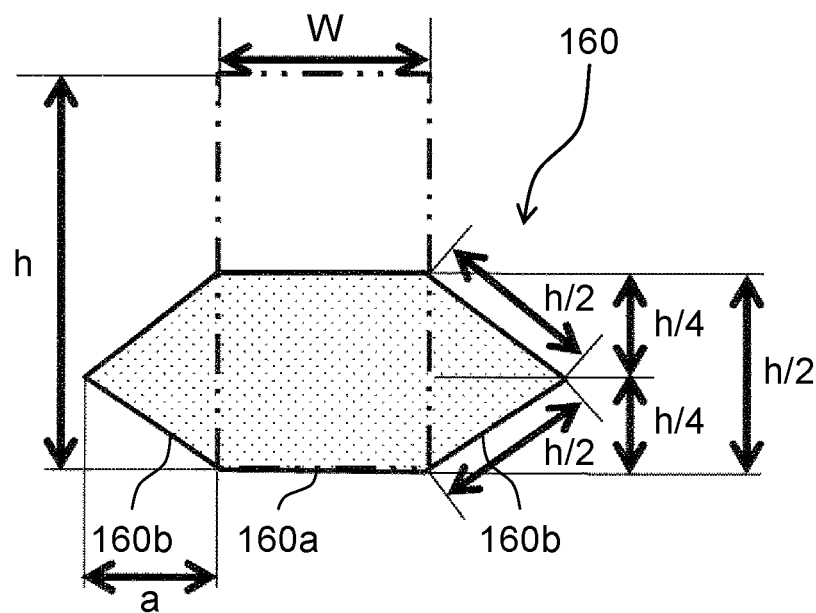
FIG. 5B is a drawing illustrating a shape of the compressed gasket that is assumed when the shape of the first inclined surfaces is determined.

With reference to FIGS. 5A and 5B, shapes of first ribs 110d and first inclined surfaces 110e will be described in more detail. FIG. 5A is a drawing illustrating a relationship between a space between the pair of first ribs 110d, a height of the pair of first ribs 110d, and a shape of first inclined surfaces 110e and a shape of gasket 160 before being compressed. FIG. 5B is a drawing illustrating a shape of compressed gasket 160 that is assumed when the shape of first inclined surfaces 110e is determined.

Gasket 160 is put between shell 141 of USB connector 140 and rear part 110a of rear housing 112 and is compressed in a direction of thickness of the apparatus. The present exemplary embodiment assumes that through this process, gasket 160 is, as shown in FIG. 5B, compressed so as to have a thickness 50% thinner than that of the gasket before being compressed. As shown in FIG. 5B, when the gasket is thus compressed, the gasket is assumed to be deformed into a low-profile hexagon in an elevation view. The shape of first inclined surfaces 110e is determined such that in the outer surface of gasket 160 deformed in this way, rear inner surface 110i of housing 110 comes into contact with bottom 160a and first inclined surface 110e of each first rib 110d comes into contact with slope 160b.

If gasket 160 having a rectangular shape in the elevation view and height h before being compressed, as shown in FIG. 5A, is, for example, compressed and decreased by 50% in thickness to height (h/2), length a of a part of gasket 160 is assumed to be a length shown by Equation 1. Above-described first predetermined space r1 between the pair of first ribs 110d is determined by substituting this length a and width w of gasket 160 before being compressed into Equality 2. As shown in Inequality 3, height t of first rib 110d is determined so as to be greater than height (0.5 h), half of height h of gasket 160 before being compressed.

$$a=\sqrt{(h/2)^2-(h/4)^2}=\sqrt{3}h/4 \qquad \text{[Equation 1]}$$

$$r=w+2a=w+\sqrt{3}h/2 \qquad \text{[Equation 2]}$$

$$t>0.5h \qquad \text{[Inequality 3]}$$

First inclined surface 110e is set to a linear surface connecting a position on first rib 110d h/4 above rear part 110a to a position that is at a distance of length a from one first facing side surface 110c of first rib 110d toward other first facing side surface 110c. In this state, a length of first inclined surface 110e is h/2 in the elevation view.

The shapes of first ribs 110d and first inclined surfaces 110e are determined as described above to allow the outer surface of compressed gasket 160 to come into continuous contact with first facing side surfaces 110c and rear inner surface 110i.

An actual shape of compressed gasket 160 is not hexagonal as described above but slightly roundish in shape in the elevation view. This roundish shape facilitates adhesion with bottom 160a and slopes 160b of gasket 160 pressed against rear inner surface 110i and first inclined surfaces 110e.

Figure 6A:
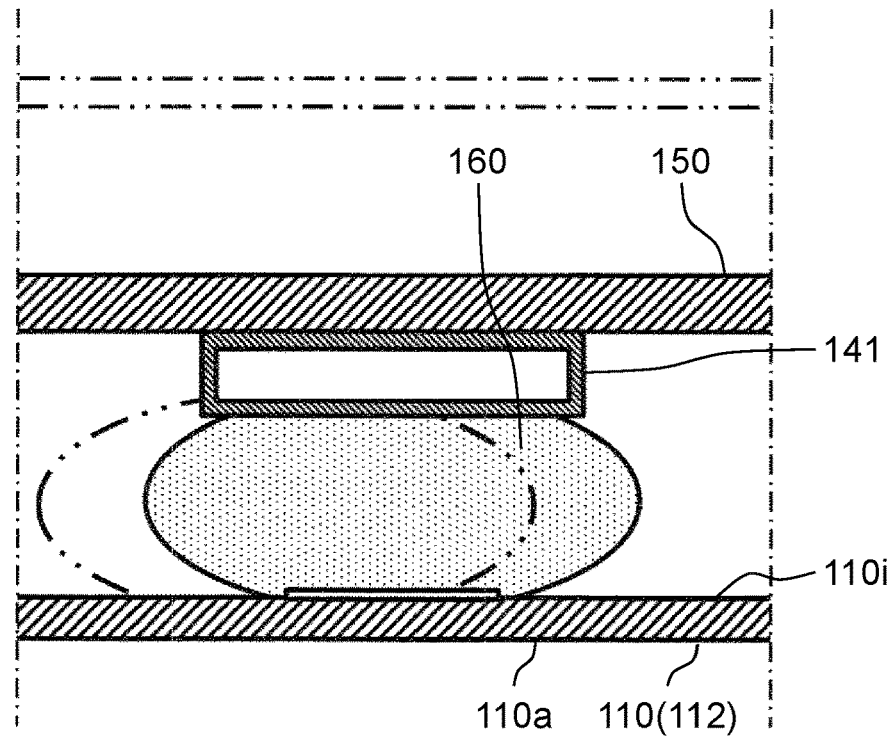
FIG. 6A is a drawing illustrating a challenge.

FIG. 6A is a drawing illustrating a challenge posed to the related art. A conventional configuration shown in FIG. 6A does not include first rib 110d and first inclined surface 110e that are provided in this exemplary embodiment. Gasket 160 is compressed by shell 141 of USB connector 140 and rear inner surface 110i of housing 110. In this state, gasket 160, depending on a direction of the compressive force, rolls laterally in FIG. 6A. Consequently, as indicated with a dash-dot-dot line, the gasket deviates from a position at which the gasket should be originally disposed. The gasket that has positionally deviated may come into contact with another part located in the surrounding area, resulting in a short circuit or other failure.

Figure 6B:
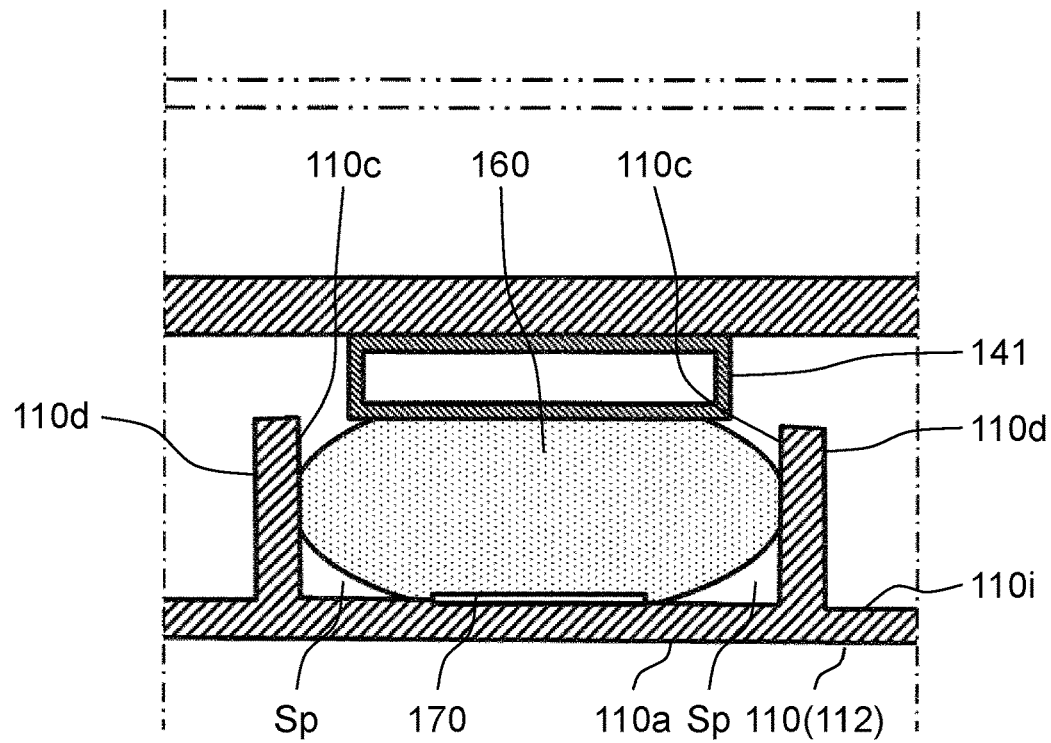
FIG. 6B is a drawing illustrating a challenge.

FIG. 6B shows a configuration devised by an inventor to solve the challenge posed to the configuration of FIG. 6A. In the configuration of FIG. 6B, a pair of first ribs 110d stand on rear inner surface 110i of housing 110 so as to extend parallel to each other with a space provided between the first ribs. Gasket 160 is disposed between the pair of first ribs 110d. This configuration enables the pair of first ribs 110d to inhibit gasket 160 from rolling, but presents another challenge. In other words, near a bottom end of first rib 110d, gap Sp appears between first facing side surface 110c of first rib 110d and rear inner surface 110i of housing 110. This does not ensure a satisfactory area of contact between gasket 160 and housing 110 in some cases. It is preferred, in order to hinder unnecessary emission of electromagnetic noise with greater reliability, that the area of contact between gasket 160 and housing 110 be as large as possible and that contact resistance between the two parts be as low as possible. However, implementation of this is difficult with the configuration of FIG. 6B.

To address this challenge, as shown in FIG. 4, first inclined surfaces 110e are provided and the shape of first inclined surfaces 110e is determined based on the shape of gasket 160 compressed as described above. This configuration eliminates gaps Sp between gasket 160 and housing 110 and allows gasket 160 to come into continuous contact with first facing side surface 110c of each first rib 110d and rear inner surface 110i of housing 110. This in turn increases the area of contact between gasket 160 and housing 110 and decreases contact resistance and hence hinders unnecessary emission of electromagnetic noise. This also inhibits gasket 160 from rolling.

Second Exemplary Embodiment

Figure 7:
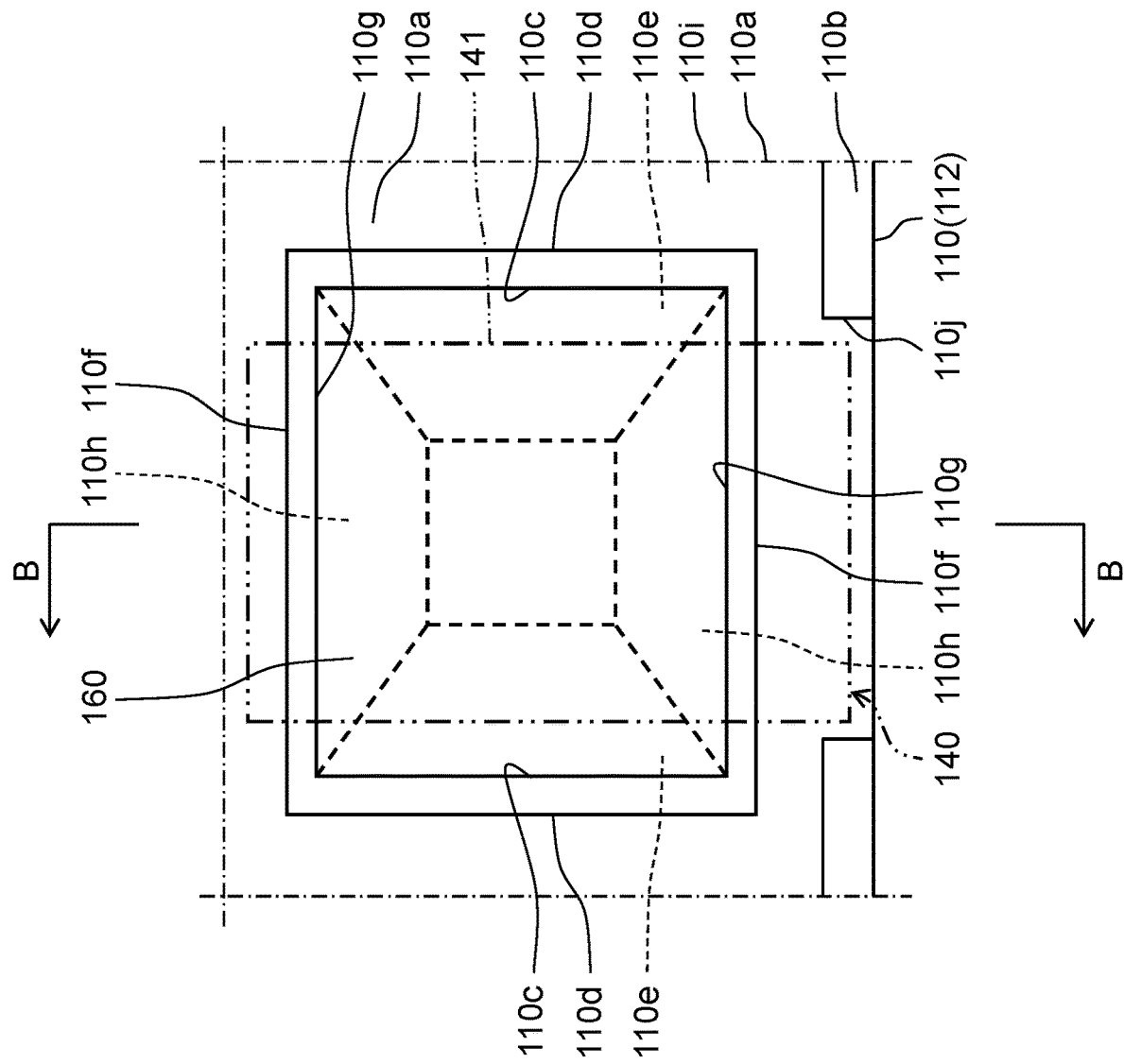
FIG. 7 is a schematic plan view showing a portion of a tablet computer according to a second exemplary embodiment in which a USB connector is disposed.
Figure 8:
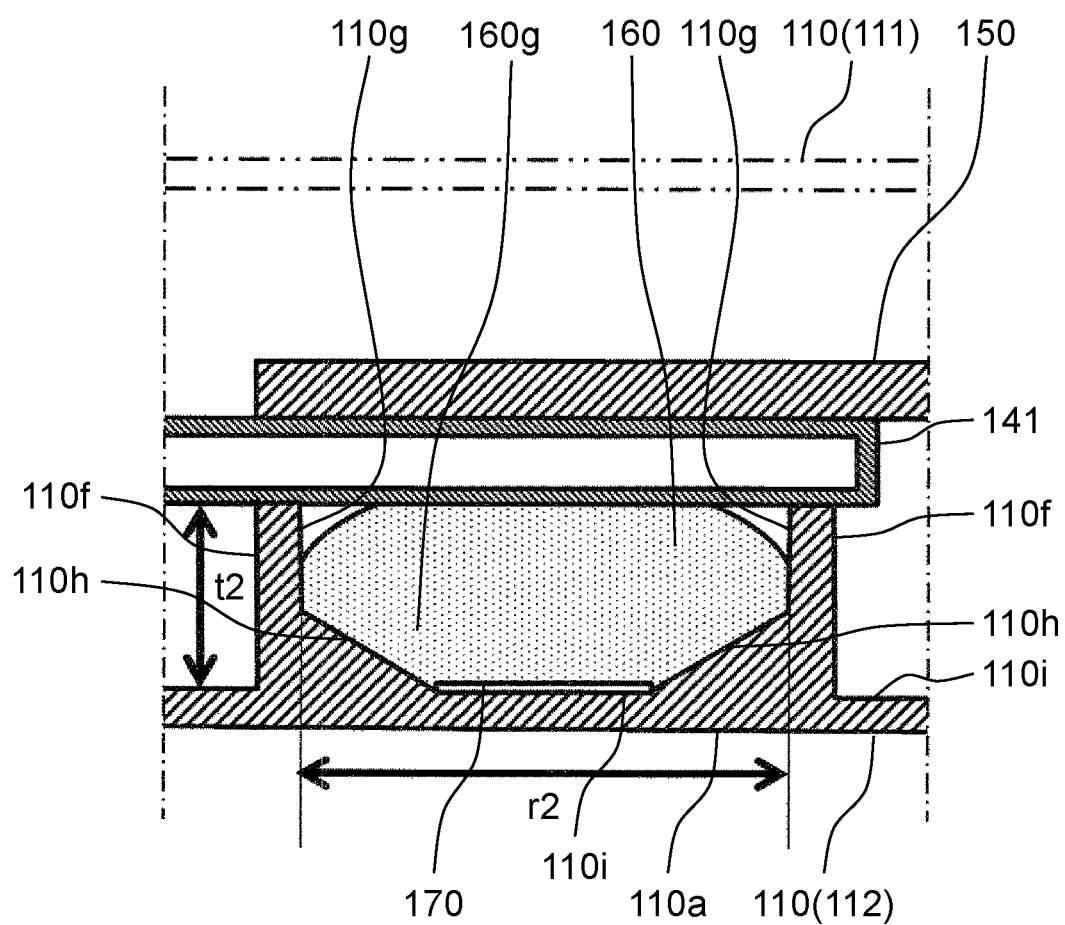
FIG. 8 is a cross-sectional view taken along line B-B of FIG. 7.

A second exemplary embodiment will be described. FIG. 7 is a schematic plan view showing a portion of a tablet computer according to the second exemplary embodiment in which USB connector 140 is disposed. FIG. 8 is a cross-sectional view taken along line B-B of FIG. 7.

As shown in FIGS. 7 and 8, on an inner surface of rear part 110a of housing 110, a pair of second ribs 110f stand so as to extend orthogonal to the pair of first ribs 110d, with second predetermined space r2 provided between the second ribs. Gasket 160 is disposed between the pair of first ribs 110d. At the same time, gasket 160 is disposed between the pair of second ribs 110f.

Each one second rib 110f has right and left side surfaces of which second facing side surface 110g is placed face-to-face with other second rib 110f. An outer surface of gasket 160 has portion 160g that faces each second facing side surface 110g and rear inner surface 110i. Second facing side surface 110g is provided with second inclined surface 110h such that portion 160g of gasket 160 comes into continuous contact with second facing side surface 110g and rear inner surface 110i. Second predetermined space r2 between the pair of second ribs 110f, height t2 of second ribs 110f, and a shape of second inclined surfaces 110h are formed based on a concept similar to that on which the shapes of first ribs 110d and first inclined surfaces 110e are based.

The configuration according to the second exemplary embodiment includes the pair of second ribs 110f and second inclined surfaces 110h and is thus able to inhibit gasket 160 from rolling in a direction along first ribs 110d. This configuration also allows gasket 160 to come into continuous contact with second facing side surface 110g of each second rib 110f and rear inner surface 110i of housing 110. This hinders unnecessary emission of electromagnetic noise with greater reliability.

[2. Effects and Others]

Tablet computer 100 (an example of an electronic apparatus) according to any of the first and second exemplary embodiments includes housing 110, USB connector 140 (an example of an electronic component), and gasket 160 (an example of an electrically conductive elastic member). Housing 110 has conductivity. USB connector 140 includes shell 141 (an example of an outer shell) having conductivity and is housed in housing 110 such that shell 141 is separated from rear inner surface 110i (an example of a predetermined inner surface) of housing 110. Gasket 160 has conductivity and elasticity and is disposed between shell 141 of USB connector 140 and rear inner surface 110i of housing 110 such that the gasket is compressed by shell 141 and rear inner surface 110i. A pair of first ribs 110d stand on rear inner surface 110i so as to extend parallel to each other, with first predetermined space r1 provided between the first ribs. Gasket 160 is disposed between the pair of first ribs 110d. Each one of first ribs 110d has side surfaces of which first facing side surface 110c is placed face-to-face with other first rib 110d. First facing side surface 110c is provided with first inclined surface 110e. First inclined surface 110e is formed such that first facing side surface 110c and rear inner surface 110i come into continuous contact with portion 160f of an outer surface of compressed gasket 160. Portion 160f faces facing side surface 110c and rear inner surface 110i.

In the first and second exemplary embodiments, gasket 160 is disposed between the pair of first ribs 110d. This prevents gasket 160 from moving to outside a region between the pair of first ribs 110d. Hence, this configuration inhibits gasket 160 from rolling. Gasket 160 is disposed between shell 141 of USB connector 140 and rear inner surface 110i of housing 110 such that the gasket is compressed by shell 141 and rear inner surface 110i. Gasket 160 is allowed to come into continuous contact with first facing side surface 110c of each first rib 110d and rear inner surface 110i of housing 110. This hinders unnecessary emission of electromagnetic noise.

In the first and second exemplary embodiments, first predetermined space r1 between the pair of first ribs 110d, height h of the pair of first ribs 110d, and the shape of first inclined surfaces 110e are determined with an estimation of the shape of compressed gasket 160 based on the shape of gasket 160 before being compressed.

This means that first predetermined space r1 between the pair of first ribs 110d, height h of the pair of first ribs 110d, and the shape of first inclined surfaces 110e can be suitably determined in response to a shape of gasket 160 that is to be used.

In the second exemplary embodiment, the pair of second ribs 110f stand on rear inner surface 110i so as to extend orthogonal to the pair of first ribs 110d, with second predetermined space r2 provided between the second ribs. Gasket 160 is disposed between the pair of second ribs 110f.

Gasket 160 is disposed between the pair of second ribs 110f. This prevents gasket 160 from moving to outside a region between the pair of second ribs 110f. Hence, this configuration more satisfactorily inhibits gasket 160 from rolling.

In the second exemplary embodiment, each one second rib 110f has side surfaces of which second facing side surface 110g is placed face-to-face with other second rib 110f. Each second facing side surface 110g is provided with second inclined surface 110h. Second inclined surface 110h is formed such that second facing side surface 110g and rear inner surface 110i come into continuous contact with portion 160g of an outer surface of compressed gasket 160 facing second facing side surface 110g and rear inner surface 110i.

This configuration allows gasket 160 to come into continuous contact with second facing side surface 110g of each second rib 110f and rear inner surface 110i of housing 110. This more satisfactorily hinders unnecessary emission of electromagnetic noise.

In the second exemplary embodiment, second predetermined space r2 between the pair of second ribs 110f, height h2 of the pair of second ribs 110f, and the shape of second inclined surfaces 110h are determined with an estimation of the shape of compressed gasket 160 based on the shape of gasket 160 before being compressed.

This means that second predetermined space r2 between the pair of second ribs 110f, height h2 of the pair of second ribs 110f, and the shape of second inclined surfaces 110h can be suitably determined in response to a shape of gasket 160 that is to be used.

In the first and second exemplary embodiments, the electronic component is USB connector 140, and the outer shell is shell 141 of USB connector 140.

This configuration hinders USB connector 140, which is apt to generate high-frequency electromagnetic noise, from unnecessarily emitting such noise.

Other Exemplary Embodiments

As described above, the first and second exemplary embodiments have been described as examples of the technique of the present disclosure. However, the technique of the present disclosure is not limited to the exemplary embodiments, and is also applicable to other exemplary embodiments that undergo some modifications, replacements, additions, omissions, or the like, as appropriate. New exemplary embodiments can be achieved by combining the elements described in the first and second exemplary embodiments. Thus, other exemplary embodiments will be described below as examples.

(1) In the first and second exemplary embodiments illustrated above, the electronic component is USB connector 140, and the outer shell is shell 141 of USB connector 140, for example. However, the electronic component in the present disclosure is any electronic component that has an outer shell made of metal. For instance, the electronic component may be an HDMI connector, and the outer shell may be a shell of the HDMI connector. This configuration hinders the HDMI connector, which is apt to generate high-frequency electromagnetic noise, from unnecessarily emitting such noise.

(2) In the second exemplary embodiment illustrated above, second ribs 110f are also provided with second inclined surfaces 110h. However, in the present disclosure, it is not essential that the second ribs are provided with the second inclined surfaces.

Figure 9:
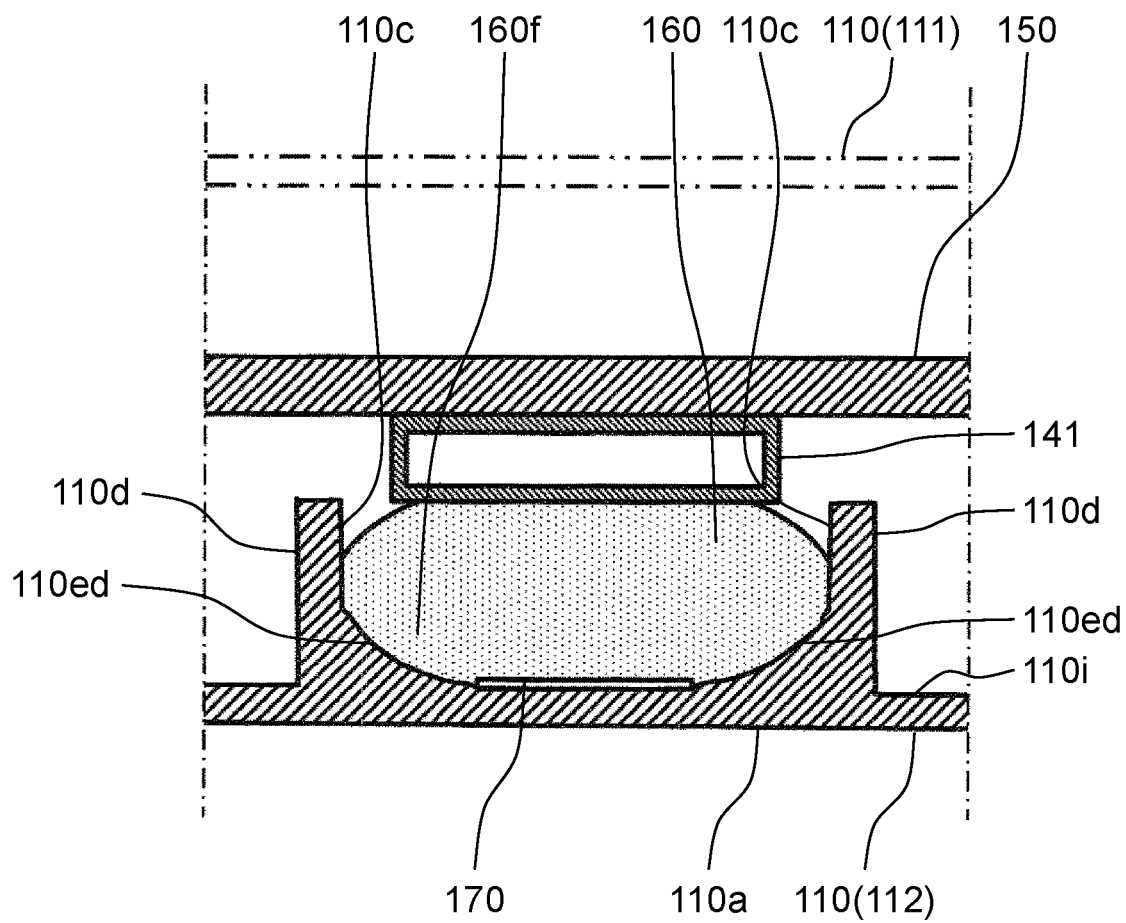
FIG. 9 is a drawing that is comparable to FIG. 4 and according to another exemplary embodiment.

(3) In the first and second exemplary embodiments, first inclined surfaces 110e and second inclined surfaces 110h are inclined linearly. However, first inclined surfaces 110e and second inclined surfaces 110h may be inclined curvilinearly. For instance, as shown in FIG. 9, inclined surfaces 110ed may be inclined curvilinearly. FIG. 9 shows an example configuration comparable to FIG. 4 of the first exemplary embodiment in which only a shape of inclined surfaces 110ed differs from that in FIG. 4.

As described above, the exemplary embodiments have been described as examples of the technique of the present disclosure. For that purpose, the accompanying drawings and the detailed description have been provided. Accordingly, in order to exemplify the technique described above, the components described in the accompanying drawings and the detailed description may not only include components that are essential for solving the problems, but also include components that are not essential for solving the problems. For this reason, it should not be immediately deemed that those unessential components are essential just because those unessential components are described in the accompanying drawings and the detailed description. Each exemplary embodiment described above is provided to exemplify the technique according to the present disclosure. Therefore, it is possible to make various changes, replacements, additions, omissions, and the like within the scope of the claims and equivalents thereof.

INDUSTRIAL APPLICABILITY

The present disclosure is applicable to a wide range of electronic apparatuses having electrically conductive elastic members.

What is claimed is:

1. An electronic apparatus comprising:
   a housing having conductivity;
   an electronic component including an outer shell having conductivity, the electronic component being housed in the housing in such a way that the outer shell is separated from a predetermined inner surface of the housing; and
   an electrically conductive elastic member having conductivity and elasticity and being disposed between the outer shell of the electronic component and the predetermined inner surface of the housing in such a way that the electrically conductive elastic member is compressed by the outer shell and the predetermined inner surface,
   wherein a pair of first ribs stand on the predetermined inner surface so as to extend parallel to each other with a first predetermined space provided between the first ribs,
   wherein the electrically conductive elastic member is disposed between the pair of the first ribs, and
   wherein the first ribs have first facing side surfaces facing each other, each of the first facing side surfaces has a first inclined surface in such a way that each of the first facing side surfaces and the predetermined inner surface is in continuous contact with a corresponding part of an outer surface of the electrically conductive elastic member that is compressed, each of the first facing side surfaces and the predetermined inner surface facing the corresponding part of the outer surface.

2. The electronic apparatus according to claim 1, wherein the first predetermined space between the pair of the first ribs, a height of the pair of the first ribs, and a shape of the first inclined surface are determined with an estimation of a shape of the compressed electrically conductive elastic member based on a shape of the electrically conductive elastic member before being compressed.

3. The electronic apparatus according to claim 1,
   wherein a pair of second ribs stand on the predetermined inner surface so as to extend perpendicular to the pair of the first ribs with a second predetermined space provided between the second ribs, and
   wherein the electrically conductive elastic member is disposed between the pair of the second ribs.

4. The electronic apparatus according to claim 3, wherein the second ribs have second facing side surfaces facing each other, each of the second facing side surfaces has a second inclined surface in such a way that each of the second facing side surfaces and the predetermined inner surface is in continuous contact with a corresponding part of the outer surface of the electrically conductive elastic member that is compressed, each of the second facing side surfaces and the predetermined inner surface facing the corresponding part of the outer surface.

5. The electronic apparatus according to claim 4, wherein the second predetermined space between the pair of the second ribs, a height of the pair of the second ribs, and a shape of the second inclined surface are determined with an estimation of a shape of the compressed electrically conductive elastic member based on a shape of the electrically conductive elastic member before being compressed.

6. The electronic apparatus according to claim 1,
wherein the electronic component is a universal serial bus (USB) connector, and
wherein the outer shell is a shell of the USB connector.

7. The electronic apparatus according to claim 1,
wherein the electronic component is a high-definition multimedia interface (HDMI) connector, and
wherein the outer shell is a shell of the HDMI connector.

* * * * *